United States Patent [19]

Katakura et al.

[11] 4,112,387
[45] Sep. 5, 1978

[54] BIAS CIRCUIT

[75] Inventors: Masayuki Katakura, Yokohama; Hisashi Yamada, Kawasaki, both of Japan

[73] Assignee: Tokyo Shibaura Electric Co., Ltd., Kawasaki, Japan

[21] Appl. No.: 768,560

[22] Filed: Feb. 14, 1977

[51] Int. Cl.$^2$ ............................................. H03G 3/30
[52] U.S. Cl. .................................... 330/285; 330/263; 330/293; 330/296
[58] Field of Search ...................... 330/13, 15, 22, 40, 330/29, 85, 263, 278, 285, 293, 296

[56] References Cited

U.S. PATENT DOCUMENTS

| | | | |
|---|---|---|---|
| 3,573,645 | 4/1971 | Wheatley | 330/15 |
| 3,714,462 | 1/1973 | Blackmer | 328/145 X |
| 3,942,128 | 3/1976 | Seki et al. | 330/40 X |

*Primary Examiner*—James B. Mullins
*Attorney, Agent, or Firm*—Oblon, Fisher, Spivak, McClelland & Maier

[57] ABSTRACT

A bias circuit comprises first and second cascade-connected transistors of the same conductivity type; series-connected diode means adapted to be forward biased by part of a drive current toward the first and second transistors; and means for applying a voltage across a series circuit of the diode means between the bases of the first and second transistors, emitter voltages of the first and second transistors being applied to a next stage class B push-pull circuit.

8 Claims, 8 Drawing Figures

BIAS CIRCUIT

This invention relates to a bias circuit as applied to a class B push-pull circuit and in particular to a voltage-controlled variable gain circuit in a noise reduction circuit.

In order to prevent a cross over distortion near the zero point of a signal it is required that a small idling current be flowed through a class B push-pull circuit using complementary transistors. In this case, a stable idling current is required for stable operation of the class B push-pull circuit. If an idling current is too great, a power loss and thermal runaway occur. If, on the other hand, it is too small, a cross over distortion takes place. In particular, a voltage-controlled variable gain circuit (see U.S. Pat. No. 3,714,462) in a noise reduction circuit requires a high accurate small idling current so as to obtain excellent sound effect. A bias circuit permits a flow of an idling current.

Figure 1:
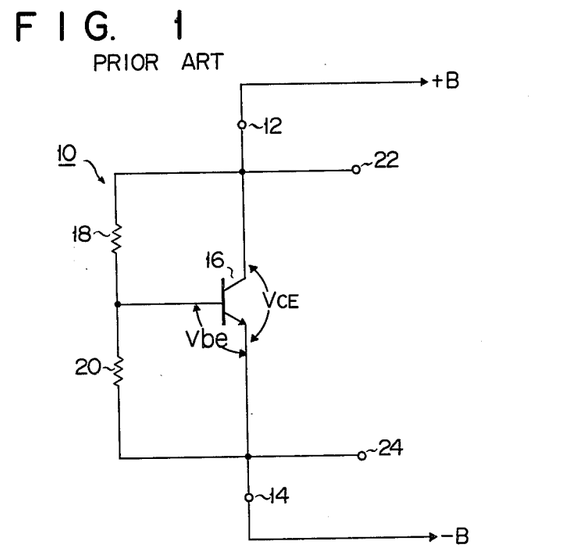
FIG. 1 is a circuit diagram showing a conventional bias circuit.

FIG. 1 shows a conventional bias circuit 10 comprising an NPN transistor 16 having a collector connected to a terminal 12 leading to a positive power source +B and an emitter connected to a terminal 14 leading to a negative power source −B, and a series circuit of first and second resistors 18 and 20, a junction of the resistors 18 and 20 being connected to the base of the transistor 16. In FIG. 1, reference numerals 22 and 24 are bias voltage extracting output terminals. The conventional bias circuit 10 has, for example, the following disadvantages.

(1) An idling current induced has a high ambient temperature variation dependence i.e., the value of the idling current is greatly varied due to the variation of the ambient temperature.

(2) An idling current induced has a high power source voltage variation dependence, i.e., the value of the idling current is greatly varied.

(3) The bias voltage of the bias circuit is determined by the resistance ratio of the series resistors 18 and 20 and in consequence the bias circuit is not fit for its IC version.

The ambinet temperature variation dependence will be explained below by referring to FIGS. 1 and 2.

Figure 2:
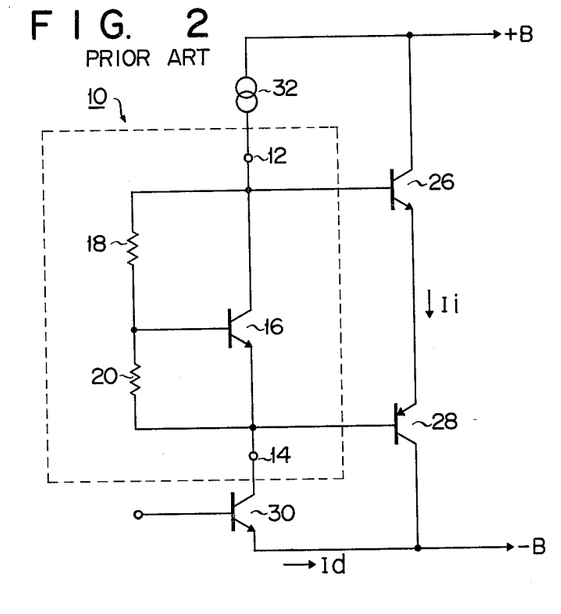
FIG. 2 is a circuit diagram showing a class B push-pull circuit into which the bias circuit in FIG. 1 is incorporated.

FIG. 2 is a class B push-pull circuit into which the bias circuit 10 is incorporated. The push-pull circuit comprises complementary transistors 26 and 28 cascade-connected between the positive power source +B and the negative power source −B, an NPN transistor 30 connected between the emitter of the transistor 16 and the negative power source −B and serving as a driver element, and a constant current power source 32 connected between the positive power source +B and the collector of the transistor 16.

Suppose that the collector-emitter voltage of the transistor 16 is $V_{ce}$, $$V_{ce} = [(R_1 + R_2)/R_1] V_{be} = (1 + R_2/R_1) V_{be}$$

where $V_{be}$: base-emitter voltage of the transistor 16
$R_1$: resistive value of the resistor 18
$R_2$: resistive value of the resistor 20

In order to make an idling current $I_i$ (an idling current through the transistors 26 and 28) free from the temperature dependence, it is necessary that $R_1 = R_2$, i.e., $V_{ce} = 2V_{be}$. Usually, the idling current should be selected to $1/x$ ($x$ denotes a small number) of a value of a driving current $I_d$ (i.e. a driving current through the transistor 30) for the class B push-pull circuit and $1/y$ ($y$ denotes a few hundreds) of the value of the driving current $I_d$ for a voltage controlled variable gain circuit in a noise reduction circuit. The $R_1$ and $R_2$ should be so selected that the collector-emitter voltage $V_{be}$ becomes smaller than a two-fold base-emitter voltage $V_{be}$. In this case, the idling current has a positive temperature coefficient and at a lower temperature a cross over distortion occurs, while at a high temperature a power loss is increased. Such phenomena are more manifested if a ratio between the driving current $I_d$ and the idling current $I_i$ becomes great. In consequence, a great disadvantage is involved of the bias circuit used in the class B push-pull circuit an inparticular in a voltage-controlled variable gain circuit in a noise reduction circuit.

Figure 3:
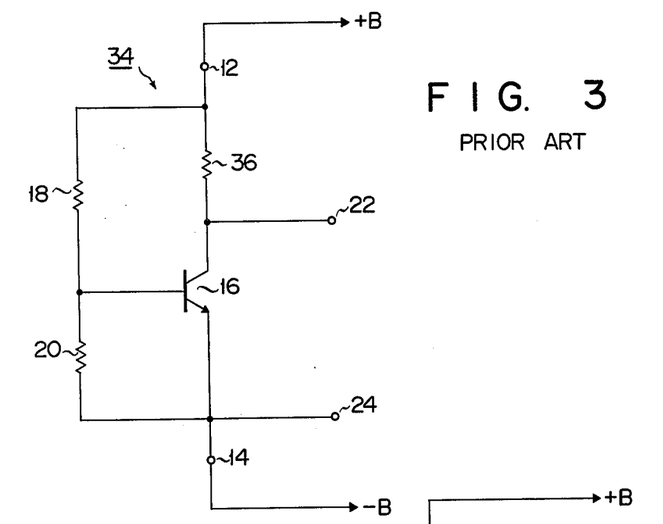
FIG. 3 is a circuit diagram showing another conventional bias circuit.

A bias circuit 34 in FIG. 3 is known as a circuit for decreasing the ambient temperature variation dependence. In the bias circuit shown in FIG. 3 a third resistor 36 is added to the bias circuit 10 in FIG. 1. The third resistor 36 is connected between the transistor 16 and the positive power source +B. In the bias circuit 34 shown in FIG. 3 the resistive values $R_1$ and $R_2$ of the resistors 18 and 20 are so selected that the collector-emitter voltage $V_{ce}$ is as great as, or somewhat greater than, a two-fold base-emitter voltage $V_{be}$. A difference voltage between a voltage drop across a series circuit of the resistors $R_1$ and $R_2$ and a voltage drop across the resistor 36 is applied, as a bias voltage, between the output terminals 22 and 24. Although the bias circuit 34 permits the ambinet temperature variation dependence characteristic of an idling current to be lowered, the power source voltage variation dependence characteristic of the idling current becomes disadvantageously great, since the voltage drop across the resistor 36 is dependent upon a driving current at a driver stage. The power source voltage variation dependence characteristic becomes more prominent, like the temperature dependence characteristic, with an increase in the value of a ratio between the driving current Id at the driver stage and the idling current. As a result, it is practically impossible to use the above-mentioned bias circuit in the voltage controlled variable gain circuit in a noise reduction device.

The conventional bias circuit has the following disadvantages when it is constructed in the IC form.

In the class B push-pull circuit shown in FIG. 2, the value of an idling current $I_i$ is set by adjusting a voltage division ratio between the series resistors 18 and 20 in the bias circuit 10. In general, each resistor to be incorporated into an integral circuit has a relatively high order of relative accuracy and it is possible to provide resistors with a relative accuracy variation of ±2%. Since, however, the relative accuracy of the resistive values $R_1$ and $R_2$ of the resistors 18 and 20 in the bias circuit 10 in FIG. 1 exponentially exerts an influence on an idling current, even such a variation (±2% of relative accuracy) will lead to a great variation of an idling current.

It is accordingly the object of this invention to provide a bias circuit which is suitable for an IC version and permits a supply in a class B push-pull circuit of an idling current whose ambinet temperature variation dependence characteristic and power source voltage variation dependence are lowered.

According to this invention there is provided a bias circuit, comprising cascaded-connected transistors of the same conductivity type, first and second series-connected diode means forward biased by part of a drive current toward the first and second transistors, and means for applying a voltage across the series circuit of the first and second diode means between the bases of the first and second transistors, the emitter voltages of the first and second transistors being applied to a next stage class B push-pull circuit.

This invention will be further described by way of example by referring to the accompanying drawings in which.

Figure 4:
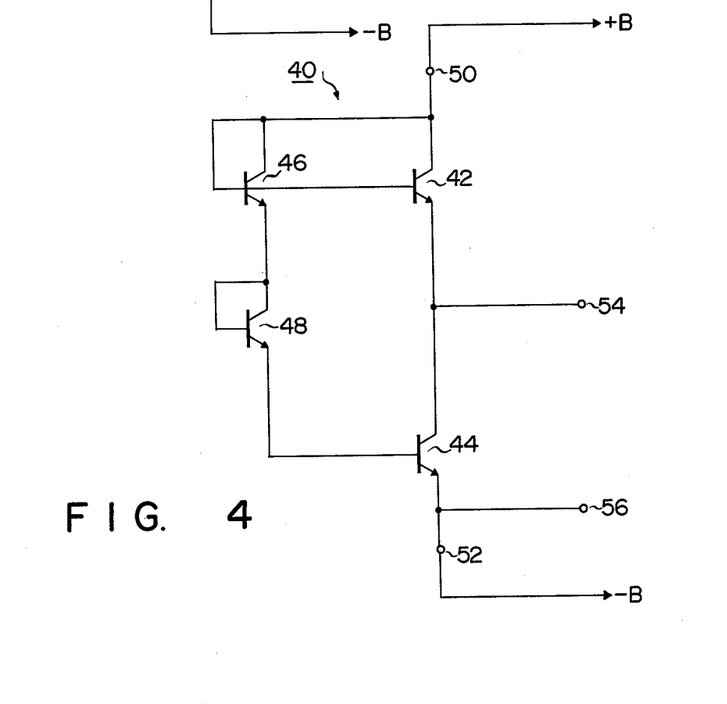
FIG. 4 is a circuit diagram showing a bias circuit according to one embodiment of this invention.

FIG. 4 shows a bias circuit 40 according to one embodiment of this invention. The bias circuit 40 comprises cascade-connected NPN type transistors 42 and 44 and diode-connected NPN type transistors 46 and 48. The collector of the transistor 42 is shorted to the base thereof and connected to a terminal 50 leading to a positive power source +B. The emitter of the transistor 42 is connected to the collector of the transistor 44 and the emitter of the transistor 44 is connected to a terminal 52 leading to a negative power source −B. The emitters of the transistors 42 and 44 are connected to bias voltage extracting output terminals 54 and 56, respectively. The base of the transistor 46 is connected to the collector thereof and a junction between the base and the collector of the transistor 46 is connected to the collector and base of the transistor 42. The emitter of the transistor 46 is connected to the collector of the transistor 48. The base of the transistor 48 is connected to the collector thereof and the emitter of the transistor 48 is connected to the base of the transistor 44.

Figure 5:
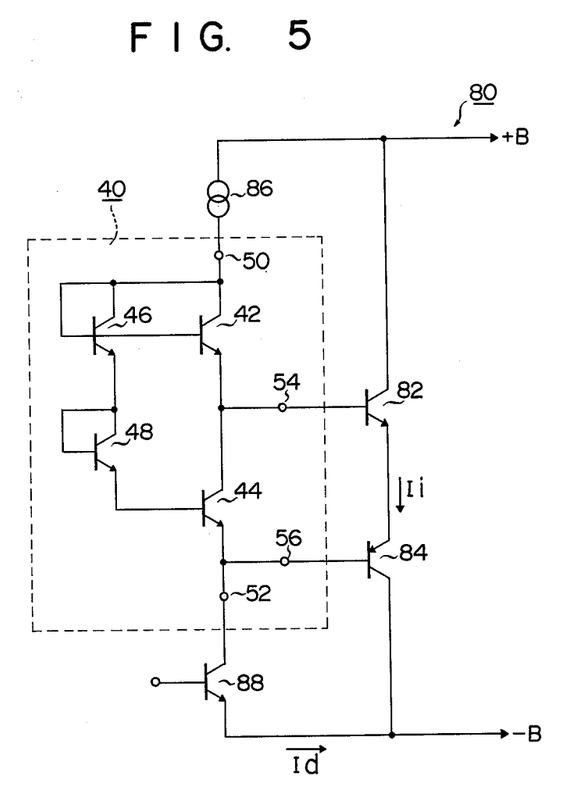
FIG. 5 is a circuit diagram showing a class B push-pull circuit into which the FIG. 4 bias circuit is incorporated.

The above-mentioned bias circuit 40 is connected to a class B push-pull circuit 80 as shown in FIG. 5. The bias circuit 40 is incorporated into the push-pull circuit 80. The push-pull circuit 80 comprises complementary transistors 82 and 84 connected between the positive power source +B and the negative power source −B, a constant current power source 86 connected between the positive power source +B and the collector of the transistor 42, and an NPN transistor 88 connected between the negative power source −B and the emitter of the transistor 44 and adapted to function as a drive element.

In the circuit arrangement shown in FIG. 5 most of a current $I_d$ through the transistor 88 flows from the transistors 42 and 44 and only $1/hfe$ of the current $I_d$ flows through the transistors 46 and 48, where denotes a DC amplification of the transistor 44. When the transistors 42 and 44 have the same characteristic, the base-emitter voltages $V_{be}$ of the transistors 42 and 44 becomes equal to each other and a potential on one end of a series circuit of the transistors 46 and 48 appears at the output terminal 54, while a potential on the other end of said series circuit appears at the output terminal 56, i.e., the collector voltage of the transistor 46 appears at the output terminal 54 and the emitter voltage of the transistor 48 appears at the output terminal 56. The collector voltage of the transistor 46 is applied as a bias voltage to the base of the transistor 82 and the emitter voltage of the transistor 48 is applied as a bias voltage to the base of the transistor 84. Where the NPN transistors 82 and 84 connected to the output terminals 54 and 56, respectively, have the same characteristic, an idling current $I_i$ through the transistors 82 and 84 can be determined to $1/hfe$ where $hfe$ is the DC amplification of the transistor 44. That is, the value of the idling current $I_i$ is dependent upon $hfe$ of the transistor 44. In general, the $hfe$ of the transistor is about 200 to 300, and the ambient temperature variation dependence characteristic and power source voltage variation dependence characteristic are very small. In consequence, the idling current $I_i$ becomes very small and the ambient temperature variation dependence characteristic and power source voltage variation dependence characteristic become small.

If the same characteristic of the NPN transistor 82 and PNP transistor 84 are difficult to obtain, either one of the transistors 46 and 48 may be replaced by a PNP transistor.

Figure 6:
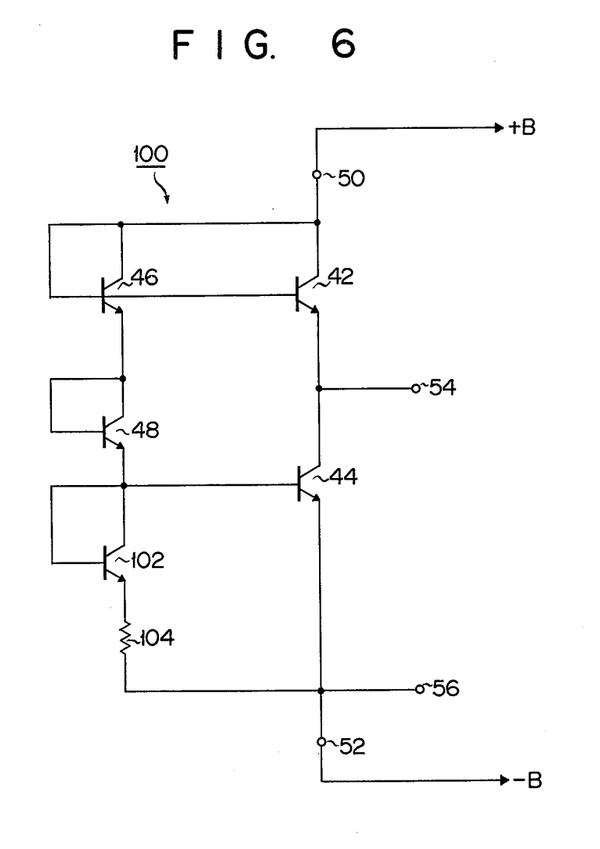
FIG. 6 is a circuit diagram showing a bias circuit according to another embodiment of this invention.

FIG. 6 shows a bias circuit 100 according to another embodiment of this invention. In the bias circuit shown in FIG. 6, a current bypass series circuit of a diode-connected NPN transistor 102 and resistor 104 are added to the circuit shown in FIG. 4. The same reference numerals are employed to designate parts and elements corresponding to those shown in FIG. 4 and further explanation is therefore omitted. In the bias circuit 100 a current through the transistors 46 and 48 is bypassed through the transistor 102 and resistor 104 to the emitter of the transistor 44 except that a negligibly small current flows into the base of the transistor 44. By doing so, the ambient temperature variation dependence of an idling current is more enhanced.

Figure 7:
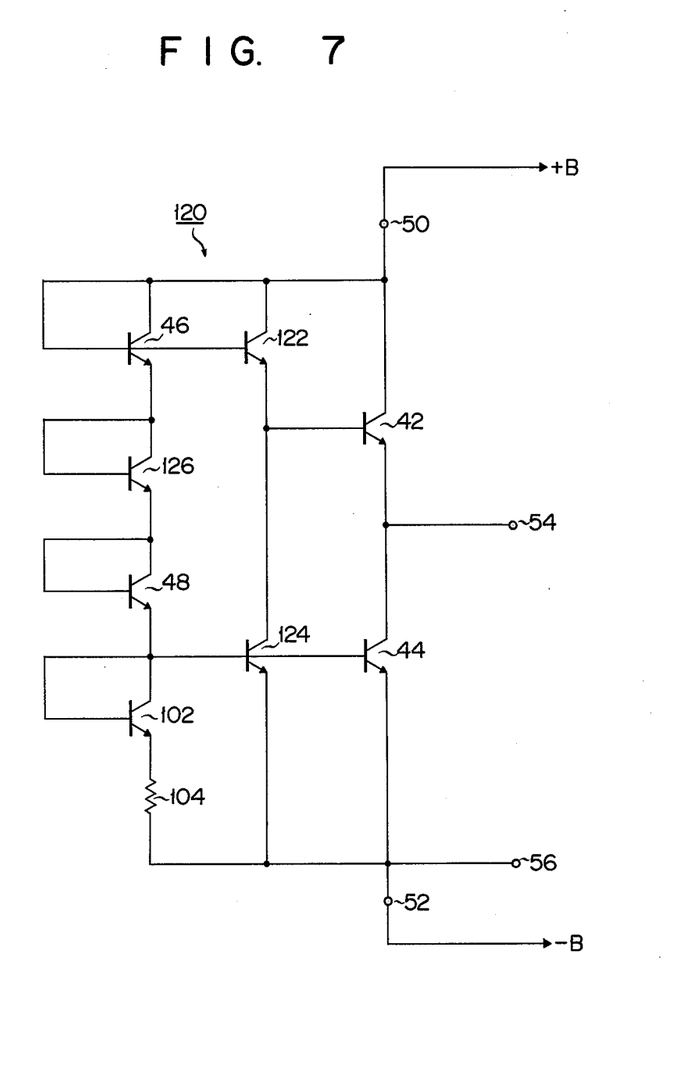
FIG. 7 is a circuit diagram showing a bias circuit according to another embodiment of this invention.

FIG. 7 shows a bias circuit 120 according to another embodiment of this invention. In this bias circuit 120 a voltage level shift circuit comprising NPN transistors 122, 124 and 126 is added to the bias circuit 100 shown in FIG. 6. To explain more in detail, the transistor 122 is a diode-connected transistor whose collector is connected to the base thereof. The collector of the transistor 122 is connected to the terminal 50 and the emitter of the transistor 122 is connected to the base of the transistor 42. The transistor 124 has a collector connected to the emitter of the transistor 122, an emitter connected to the terminal 52 and a base connected to the base of the transistor 44. The collector of the transistor 126 is shorted to the base thereof and connected to the emitter of the transistor 46. The emitter of the transistor 126 is connected to the collector of the transistor 48. The transistor 122 is used for a voltage level shift and the transistor 124 serves as a current source. The transistor 126 is used to compensate for the base-emitter voltage of the transistor 122. Since the circuit 120 has the above-mentioned voltage level shift circuit, an idling current can be widely varied without varying a ratio in area between the transistors 42 and 44. Even in the bias circuit 120, a current through the transistors 46, 126 and 48, like the bias circuit of FIG. 6, is bypassed through the series circuit of the transistor 102 and resistor 104 to the emitter of the transistor 44, thereby lowering the ambient temperature variation dependence characteristic of the idling current.

Although NPN transistors are used in the above-mentioned bias circuits 40, 100 and 120, the same result can also be obtained if such bias circuits are constructed of PNP transistors. In this case, it will be easily understood that the voltage polarity is reversed.

Figure 8:
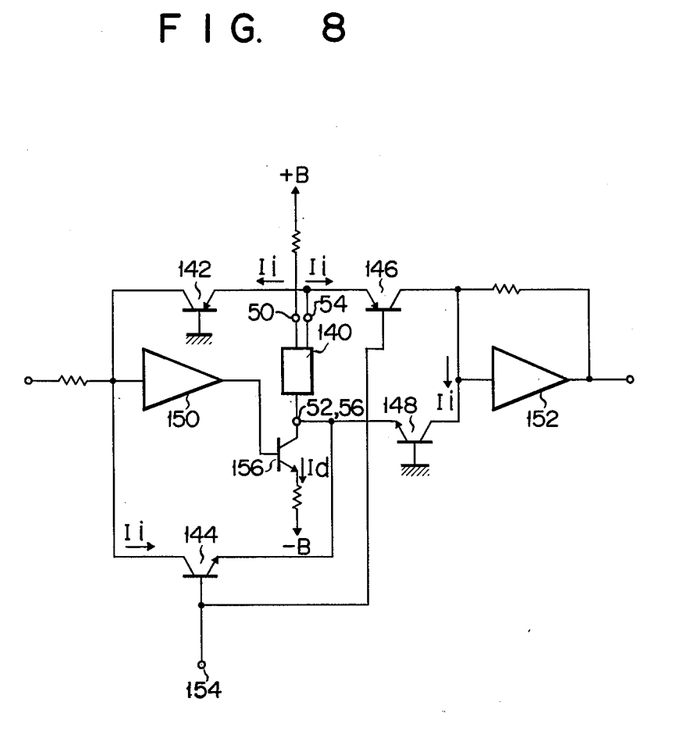
FIG. 8 shows a voltage-controlled variable gain circuit including the bias circuit, which is used in a noise reduction circuit.

FIG. 8 shows a voltage controlled variable gain circuit for use in a noise reduction circuit. Reference numeral 140 shows a bias circuit which permits an idling current $I_i$ to flow through transistors 142 and 144 and through transistors 146 and 148. Reference numerals 150 and 152 are amplifiers. The idling current $I_i$, though varied by a potential difference between a terminal 154 and ground, is selected to be about 1μA when the terminal 154 is grounded. A driving current $I_d$ through a transistor 156, which acts as a driver, is about 1 mA. When the conventional bias circuit in FIG. 1 is used, a bias voltage should be selected to be about 1.5 times as great as a base-emitter voltage. If in this case the ambient temperature is changed from room temperature to about ±50° C, the idling current $I_i$ will be increased or decreased by a factor of several tens. When the idling current is lowered, there is a fear that a cross over distortion will occur near a zero point. When, or the other hand, the idling current is increased, there is a fear that an increase in power loss as well as a thermal runaway will be induced.

As will be evident from the above-mentioned explanation, the bias circuits 40, 100 and 120 permits a flow of an idling current $I_i$ whose ambient temperature variation dependence characteristic and power source voltage variation dependence characteristic are lowered, assuring high accurate operation of the voltage controlled variable gain circuit.

Accordingly, this invention provides a bias circuit for permitting a flow through a class B push-pull circuit of an idling current whose ambient temperature variation dependence characteristic and power source voltage variation dependence characteristic are lowered. A prominent result is obtained if the bias circuit of this invention is applied particularly to a circuit, such as voltage-controlled variable gain circuit for a noise reduction circuit, which requires a small, stable idling current. Since a bias voltage is not dependent upon the resistance ratio of series resistors, the bias circuit can be suitable for an IC version.

What we claim is:

1. A voltage controlled variable gain circuit comprising
   an input terminal;
   first and second control terminals;
   an output terminal;
   first and second voltage sources having opposite polarities;
   an amplification circuit, the input side of which is connected to the input terminal;
   first and second transistors of a first conductivity type cascade-connected between the first and second voltage sources, the collector and the base of the first transistor being connected to the first voltage source, the emitter of the first transistor being connected to the collector of the second transistor, the emitter of the second transistor being connected to the second voltage source, and the emitter of the second transistor being connected to the output sides of the amplification circuit;
   first and second diode means series-connected between both bases of the first and second transistors and forward-biased by part of a drive current toward the first and second transistors;
   a first feedback circuit provided between the input side of the amplification circuit and the emitter of the second transistor, the first feedback circuit including a third transistor of the first conductivity type, the collector, emitter and base of which are connected to the input side of the amplification circuit, the emitter of the second transistor and the first control terminal, respectively, and the third transistor having a first input voltage-output current characteristic with respect to a first input voltage having a first polarity and a first output current having a first polarity;
   a second feedback circuit provided between the input side of the amplification circuit and the emitter of the first transistor, the second feedback circuit including a first active means having a second input voltage-output current characteristic with respect to a second input voltage having a second polarity opposite to the first polarity of the first input voltage and a second output current having a second polarity opposite to the first polarity of the first output current, and the second input voltage-output current characteristic being symmetrical to the first input voltage-output current characteristic;
   a first output circuit provided between the emitter of the second transistor and the output terminal, the first output circuit including a fourth transistor of the first conductivity type, the collector, emitter and base of which are connected to the output terminal, the emitter of the second transistor and the second control terminal, and the fourth transistor having a third input voltage-output current characteristic with respect to the first input voltage having the first polarity and the first output current having the first polarity; and
   a second output circuit provided between the emitter of the first transistor and the output terminal, the second output circuit including a second active means having a fourth input voltage-output current characteristic with respect to the second input voltage having the second polarity opposite to the first polarity of the first input voltage and the second output current having the second polarity opposite to the first polarity of the first output current, and third characteristic being symmetrical to the fourth characteristic.

2. The gain circuit according to claim 1 wherein the first active means is a fifth transistor of a second conductivity type, the collector, emitter and base of which are connected to the input side of the amplification circuit, the emitter of the first transistor and the second control terminal, respectively.

3. The gain circuit according to claim 1 wherein the second active means is a fifth transistor of a second conductivity type, the collector, emitter and base of which are connected to the output terminal, the emitter of the first transistor and the first control terminal, respectively.

4. The gain circuit according to claim 1 wherein the amplification circuit comprises an amplifier, the input side of which is connected to the input terminal and a transistor of the first conductivity type, the collector, emitter and base of which are connected to the emitter of the second transistor, the second voltage source and the output side of the amplifier, respectively.

5. The gain circuit according to claim 1 wherein the amplification circuit comprises an amplifier, the input side of which is connected to the input terminal, a fifth transistor of the first conductivity type, the collector and base of which are connected to the emitter of the second transistor and the output side of the amplifier, respectively and a resistor provided between the emitter of the fifth transistor and the second voltage source.

6. The gain circuit according to claim 1 further including a resistor provided between the input terminal and the input side of the amplification circuit.

7. The gain circuit according to claim 1 further including a second amplification circuit provided between the collector of the fourth transistor and the output terminal.

8. The gain circuit according to claim 7 wherein the second amplification circuit comprises an amplifier provided between the collector of the fourth transistor and the output terminal and a resistor parallel-connected to the amplifier.

* * * * *

UNITED STATES PATENT AND TRADEMARK OFFICE
CERTIFICATE OF CORRECTION

PATENT NO. : 4,112,387
DATED : September 5, 1978
INVENTOR(S) : MASAYUKI KATAKURA ET AL It is certified that error appears in the above-identified patent and that said Letters Patent are hereby corrected as shown below:

Column 1, line 29, change "ou put" to --output--;

Column 2, line 40, change "Id" to --$I_d$--.

Signed and Sealed this

First Day of May 1979

[SEAL]

Attest:

RUTH C. MASON
Attesting Officer

DONALD W. BANNER
Commissioner of Patents and Trademarks